US012446399B2

(12) United States Patent
Han et al.

(10) Patent No.: US 12,446,399 B2
(45) Date of Patent: Oct. 14, 2025

(54) DISPLAY SUBSTRATE FOR DISPLAY DEVICE SETTING TRANSITION REGION BETWEEN HIGH PIXEL PER INCH REGION AND LOW PIXEL PER INCH REGION

(71) Applicant: BOE TECHNOLOGY GROUP CO., LTD., Beijing (CN)

(72) Inventors: Long Han, Beijing (CN); Pinfan Wang, Beijing (CN); Fangxu Cao, Beijing (CN); Wenqiang Li, Beijing (CN); Libin Liu, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 59 days.

(21) Appl. No.: 17/615,489

(22) PCT Filed: Feb. 3, 2021

(86) PCT No.: PCT/CN2021/074979

§ 371 (c)(1),
(2) Date: Nov. 30, 2021

(87) PCT Pub. No.: WO2022/165658

PCT Pub. Date: Aug. 11, 2022

(65) Prior Publication Data

US 2023/0169900 A1 Jun. 1, 2023

(51) Int. Cl.
*H10K 59/121* (2023.01)
*G09G 3/00* (2006.01)
(Continued)

(52) U.S. Cl.
CPC .......... *H10K 59/121* (2023.02); *G09G 3/035* (2020.08); *G09G 3/3233* (2013.01);
(Continued)

(58) Field of Classification Search
CPC ........ G09G 3/035; G09G 3/32; G09G 3/3208; G09G 3/3216; G09G 3/3225;
(Continued)

(56) References Cited

U.S. PATENT DOCUMENTS 12,191,320 B2 * 1/2025 Li ........................ H10D 86/481
12,213,355 B2 * 1/2025 Huang ................ G09G 3/3241
(Continued)

FOREIGN PATENT DOCUMENTS

CN 107703688 A 2/2018
CN 108376523 A 8/2018
(Continued)

*Primary Examiner* — Ke Xiao
*Assistant Examiner* — Nelson Lam

(57) ABSTRACT

A display substrate and a display device are disclosed. The display substrate includes: a transition region, located between a first display region and a second display region, the first display region, the second display region and the transition region are provided with a plurality of pixels, the plurality of pixels are arranged in an array in the first direction and a second direction intersecting with the first direction, a pixel per inch (PPI) of the first display region is greater than a PPI of the second display region and a PPI of the transition region, the transition region is further provided with a row driving circuit, the row driving circuit is configured to drive the plurality of pixels in the first display region, the second display region and the transition region by rows.

17 Claims, 7 Drawing Sheets

120
OUT
130
225B
110
OUT
225A
130
120
Y
X
220/2204
225/2252
210
220/2202
225/2254
100

(51) Int. Cl.
*G09G 3/3233* (2016.01)
*G09G 3/3266* (2016.01)
*H10K 59/131* (2023.01)

(52) U.S. Cl.
CPC ......... *G09G 3/3266* (2013.01); *H10K 59/131* (2023.02); *G09G 2300/0408* (2013.01); *G09G 2300/0426* (2013.01); *G09G 2300/0439* (2013.01); *G09G 2300/0819* (2013.01); *G09G 2300/0842* (2013.01); *G09G 2300/0861* (2013.01); *G09G 2310/0286* (2013.01); *G09G 2320/0233* (2013.01)

(58) Field of Classification Search
CPC .. G09G 3/3233; G09G 3/3241; G09G 3/3258; G09G 3/3266; G09G 3/3275; G09G 3/3283; G09G 3/3291; G09G 2300/0426; G09G 2300/0439; G09G 2300/0443
USPC ...................................................... 345/76–83
See application file for complete search history.

(56) References Cited

U.S. PATENT DOCUMENTS 12,266,309 B2 * 4/2025 Wang .................. G09G 3/3233
2005/0104817 A1 * 5/2005 Kwak ................. G09G 3/2022 345/76
2007/0242007 A1 * 10/2007 Lee ...................... G09G 3/3208 345/82
2010/0066655 A1 * 3/2010 Uh .................... G02F 1/136286 345/87
2016/0071457 A1 * 3/2016 Kim ..................... G09G 3/3208 345/76
2017/0316730 A1 * 11/2017 Cheng ................... G06F 3/0412
2017/0316744 A1 * 11/2017 Oh ....................... G09G 3/2007
2019/0172406 A1 6/2019 Shima
2020/0335023 A1 10/2020 Yen
2021/0005635 A1 * 1/2021 Ban .................... H10K 59/1201
2021/0142721 A1 * 5/2021 Kim ..................... G09G 3/3208
2021/0343212 A1 * 11/2021 Tsai ......................... G09G 5/10
2023/0096961 A1 * 3/2023 Mi ........................... G09G 3/32 345/55
2023/0157097 A1 * 5/2023 Huang ............... H10K 59/1216 257/40

FOREIGN PATENT DOCUMENTS

CN 109192125 A 1/2019
CN 109637477 A 4/2019
CN 111243442 A 6/2020
CN 111402743 A 7/2020
CN 111554230 A 8/2020
CN 111584595 A 8/2020
CN 111708199 A 9/2020
CN 111816691 A 10/2020
CN 111831240 A 10/2020
WO 2016/190233 A1 12/2016

* cited by examiner

DISPLAY SUBSTRATE FOR DISPLAY DEVICE SETTING TRANSITION REGION BETWEEN HIGH PIXEL PER INCH REGION AND LOW PIXEL PER INCH REGION

TECHNICAL FIELD

Embodiments of the present disclosure relate to a display substrate and a display device.

BACKGROUND

With the continuous development of display technology, flexible display technology has been widely used in various display devices because of its advantages of low power consumption, small size, portability and various display modes. In order to improve the display quality and use effect, four curved surface screen design is widely used in smart electronic products such as mobile phones and tablet computers. The four curved surface screen design is a design combining with the 3D cover glass bonding technology, and bending the edges or corners of a display substrate according to a certain bending radius to form radians, so as to realize the comprehensive stereoscopic display of the front and the side, thus realizing the 3D stereoscopic effect of four curved surface form, thus creating a sense of stereoscopic immersion, which is in line with the future technological development trend.

SUMMARY

Embodiments of the present disclosure provides a display substrate and a display device. The display substrate provides a GIP (gate in pixel) design, that is, by setting the transition region between the high PPI region and the low PPI region, and setting a row driving circuit, such as gate driving circuit (GOA), in the transition region, the display substrate drives the high PPI region and the low PPI region on two sides of the transition region to display.

At least one embodiment of the present disclosure provides a display substrate, which includes: a first display region: a second display region, located on at least one side of the first display region in a first direction; and a transition region, located between the first display region and the second display region, the first display region, the second display region and the transition region are provided with a plurality of pixels, the plurality of pixels are arranged in an array in the first direction and a second direction intersecting with the first direction, a pixel per inch (PPI) of the first display region is greater than a PPI of the second display region and a PPI of the transition region, the transition region is further provided with a row driving circuit, the row driving circuit is configured to drive the plurality of pixels in the first display region, the second display region and the transition region by rows.

For example, in the display substrate provided by an embodiment of the present disclosure, the row driving circuit includes a plurality of row driving circuit units arranged in the second direction.

For example, in the display substrate provided by an embodiment of the present disclosure, each of the plurality of pixels includes a plurality of sub-pixels, each of the plurality sub-pixels includes a pixel driving circuit and a driving electrode electrically connected with the pixel driving circuit, and the transition region includes: a plurality of pixel circuit islands, each of the plurality of pixel circuit islands is provided with a plurality of pixel driving circuits of at least one of the plurality of pixels: a plurality of first spacing regions, each of the plurality of first spacing regions is located between two pixel circuit islands adjacent in the first direction; and at least one driving spacing region, each of the at least one driving spacing region is also located between two pixel circuit islands adjacent in the first direction, the driving spacing region is provided with the row driving circuit unit.

For example, in the display substrate provided by an embodiment of the present disclosure, the transition region further includes: a plurality of driving electrode islands, arranged corresponding to the plurality of pixel circuit islands, each of the plurality of driving electrode islands is provided with a plurality of driving electrodes of at least one of the plurality of pixels; and a plurality of second spacing regions, each of the plurality of second spacing regions is located between two driving electrode islands adjacent in the first direction.

For example, in the display substrate provided by an embodiment of the present disclosure, the plurality of first spacing regions have equal widths in the first direction, the plurality of second spacing regions have equal widths in the first direction, and a width of each of the plurality of first spacing regions in the first direction is less than a width of each of the at least one driving spacing regions in the first direction.

For example, in the display substrate provided by an embodiment of the present disclosure, the plurality of first spacing regions have equal widths in the first direction, the plurality of second spacing regions have equal widths in the first direction, and a width of each of the plurality of second spacing regions in the first direction is 0.5-1.5 times a width of each of the plurality of driving spacing regions, and a width of each of the plurality of first spacing regions in the first direction are less than a width of each of the at least one driving spacing regions in the first direction.

For example, in the display substrate provided by an embodiment of the present disclosure, the row driving circuit unit includes a first row driving circuit unit and a second row driving circuit unit, the first row driving circuit unit has an output terminal, and the output terminal of the first row driving circuit unit is configured to simultaneously drive a plurality of the pixels belonging to a same row in the first display region, the second display region and the transition region.

For example, the display substrate provided by an embodiment of the present disclosure further includes: a plurality of connection electrode structures, located at a side of the plurality of driving electrode islands close to the plurality of pixel circuit islands in a direction perpendicular to the transition region, the plurality of connection electrode structures are respectively arranged in one-to-one correspondence with the plurality of driving electrode islands and the plurality of pixel circuit islands, respectively, and each of the plurality of connection electrode structures includes a plurality of connection electrodes, so as to electrically connect the plurality of pixel driving circuits in the a corresponding pixel circuit islands with the plurality of driving electrodes in the a corresponding driving electrode islands.

For example, in the display substrate provided by an embodiment of the present disclosure, the pixel driving unit includes a driving transistor, and an orthographic projection of the driving transistor on a film layer where the a corresponding driving electrode is located is spaced apart from the corresponding driving electrode.

For example, in the display substrate provided by an embodiment of the present disclosure, the row driving circuit includes a gate driving circuit and a light-emitting control driving circuit, and the row driving circuit unit includes a gate driving unit and a light-emitting control unit, the at least one driving spacing region includes two driving spacing regions, one of the two driving spacing regions is provided with the gate driving unit, and the other of the two driving spacing regions is provided with the light-emitting control unit.

For example, in the display substrate provided by an embodiment of the present disclosure, the two driving spacing regions are spaced apart from each other by at least two of the plurality of first spacing regions.

For example, in the display substrate provided by an embodiment of the present disclosure, the light-emitting control unit includes: a first transistor, a gate electrode of the first transistor is connected with a first clock signal line to receive a first clock signal, a first electrode of the first transistor is connected with a first node, and a second electrode of the first transistor is connected with an input terminal: a second transistor, a gate electrode of the second transistor is connected with the first node, a first electrode of the second transistor is connected with the second node, and a second electrode of the second transistor is connected with the first clock signal line to receive the first clock signal: a third transistor, a gate electrode of the third transistor is connected with the first clock signal line to receive the first clock signal, a first electrode of the third transistor is connected with the second node, and a second electrode of the third transistor is connected with a first power line to receive a first voltage: a fourth transistor, a gate electrode of the fourth transistor is connected with a second clock signal line to receive a second clock signal, a first electrode of the fourth transistor is connected with the first node, and a second electrode of the fourth transistor is connected with a second electrode of a fifth transistor: the fifth transistor, a gate electrode of the fifth transistor is connected with the second node, and a first electrode of the fifth transistor is connected with a second power line to receive a second voltage: a sixth transistor, a first electrode of the sixth transistor is connected with the second clock signal line to receive the second clock signal, and a second electrode of the sixth transistor is connected with a third node: a seventh transistor, a gate electrode of the seventh transistor is connected with the second clock signal line to receive the second clock signal, a first electrode of the seventh transistor is connected with the third node, and a second electrode of the seventh transistor is connected with a fourth node: an eighth transistor, a gate electrode of the eighth transistor is connected with the first node, a first electrode of the eighth transistor is connected with the fourth node, and a second electrode of the eighth transistor is connected with the second power line to receive the second voltage: a ninth transistor, a gate electrode of the ninth transistor is connected with the fourth node, a first electrode of the ninth transistor is connected with the second power line to receive the second voltage, and a second electrode of the ninth transistor is connected with an output terminal: a tenth transistor, a first electrode of the tenth transistor is connected with the first power line to receive the first voltage, and a second electrode of the tenth transistor is connected with the output terminal: a first capacitor, a second electrode of the first capacitor is connected with the third node: a second capacitor, a second electrode of the second capacitor is connected with the second clock signal line to receive the second clock signal; and a third capacitor, a first electrode of the third capacitor is connected with the fourth node, and a second electrode of the third capacitor is connected with the second power line to receive the second voltage.

For example, in the display substrate provided by an embodiment of the present disclosure, orthographic projections of the ninth transistor and the tenth transistor on a film layer where the plurality of connection electrode structures are located are spaced apart from the plurality of connection electrode structures.

For example, in the display substrate provided by an embodiment of the present disclosure, the gate driving unit includes an input transistor, a first control transistor, a second control transistor, an output control transistor, a gate output transistor, a first noise reduction transistor, a second noise reduction transistor, a voltage stabilizing transistor, a first scanning capacitor and a second scanning capacitor, a gate electrode of the input transistor is connected with a third clock signal line, a second electrode of the input transistor is connected with an input terminal, and a first electrode of the input transistor is connected with a first scanning node: a gate electrode of the first control transistor is connected with the first scanning node, a second electrode of the first control transistor is connected with the third clock signal line, and a first electrode of the first control transistor is connected with a second scanning node: a gate electrode of the second control transistor is connected with the third clock signal line, a second electrode of the second control transistor is connected with a third power line, and a first electrode of the second control transistor is connected with the second scanning node: a gate electrode of the output control transistor is connected with the second scanning node, a first electrode of the output control transistor is connected with a fourth power line, and a second electrode of the output control transistor is connected with an output terminal: a first electrode of the first scanning capacitor is connected with the second scanning node, and a second electrode of the first scanning capacitor is connected with the fourth power line: a gate electrode of the gate output transistor is connected with a third scanning node, a first electrode of the gate output transistor is connected with a second clock sub-signal line, and a second electrode of the gate output transistor is connected with the output terminal: a first electrode of the second scanning capacitor is connected with the third scanning node, and a second electrode of the second scanning capacitor is connected with the output terminal: a gate electrode of the first noise reduction transistor is connected with the second scanning node, a first electrode of the first noise reduction transistor is connected with the fourth power line, and a second electrode of the first noise reduction transistor is connected with a second electrode of the second noise reduction transistor: a gate electrode of the second noise reduction transistor is connected with a fourth clock signal line, and a first electrode of the second noise reduction transistor is connected with the first scanning node; and a gate electrode of the voltage stabilizing transistor is connected with the third power line, a second electrode of the voltage stabilizing transistor is connected with the first scanning node, and a first electrode of the voltage stabilizing transistor is connected with the third scanning node.

For example, in the display substrate provided by an embodiment of the present disclosure, orthographic projections of the output control transistor and the gate output transistor on a film layer where the plurality of connection electrode structures are located are spaced apart from the plurality of connection electrode structures.

For example, the display substrate provided by an embodiment of the present disclosure further includes: a plurality of first driving lines, configured to drive the plurality of gate driving units, the plurality of gate driving units are arranged in a staggered way in the first direction, and each of the plurality of first driving lines includes a first portion extending in the second direction and a second portion extending in the first direction, the first portion is connected with the corresponding gate driving unit, and the second portion connects the first portions of two adjacent gate driving units.

For example, the display substrate provided by an embodiment of the present disclosure further includes a data line, the first portion and the data line are located on a first source-drain metal layer, and the second portion is located on a second source-drain metal layer.

For example, in the display substrate provided by an embodiment of the present disclosure, each of the plurality of first driving lines has a step shape.

For example, the display substrate provided by an embodiment of the present disclosure further includes: a plurality of second driving lines, configured to drive the plurality of light-emitting control units, the plurality of light-emitting control units are arranged in a staggered way in the first direction, and each of the plurality of second driving lines includes a third portion extending in the second direction and a fourth portion extending in the first direction, the third portion is connected with the a corresponding light-emitting control unit, and the fourth portion connects the third portions of two adjacent light-emitting control units.

For example, the display substrate provided by an embodiment of the present disclosure further includes a data line, the third portion and the data line are located on a first source-drain metal layer, and the fourth portion is located on a second source-drain metal layer.

For example, in the display substrate provided by an embodiment of the present disclosure, each of the plurality of second driving lines has a step shape.

For example, in the display substrate provided by an embodiment of the present disclosure, a portion of the display substrate located in the second display region is bent in a direction perpendicular to the first display region.

For example, the display substrate provided by an embodiment of the present disclosure further includes: a third display region, located at a side of the first display region in the second direction, the third display region is provided with a plurality of the pixels, a PPI of the third display region is approximately equal to a PPI of the first display region, and an orthographic projection of the third display region on a reference line extending in the first direction overlaps with all of orthographic projections of the first display region, the second display region and the transition region on the reference line.

For example, in the display substrate provided by an embodiment of the present disclosure, the second display region includes: a plurality of pixel islands, arranged in an array in the first direction and the second direction, each of the plurality of pixel islands including at least one pixel: a first opening, extending in the first direction and located between two pixel islands adjacent in the second direction; and a second opening, extending in the second direction and located between two pixel islands adjacent in the first direction.

At least one embodiment of the present disclosure further provides a display device includes any one of the above-mentioned display substrate.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

Figure 1A:
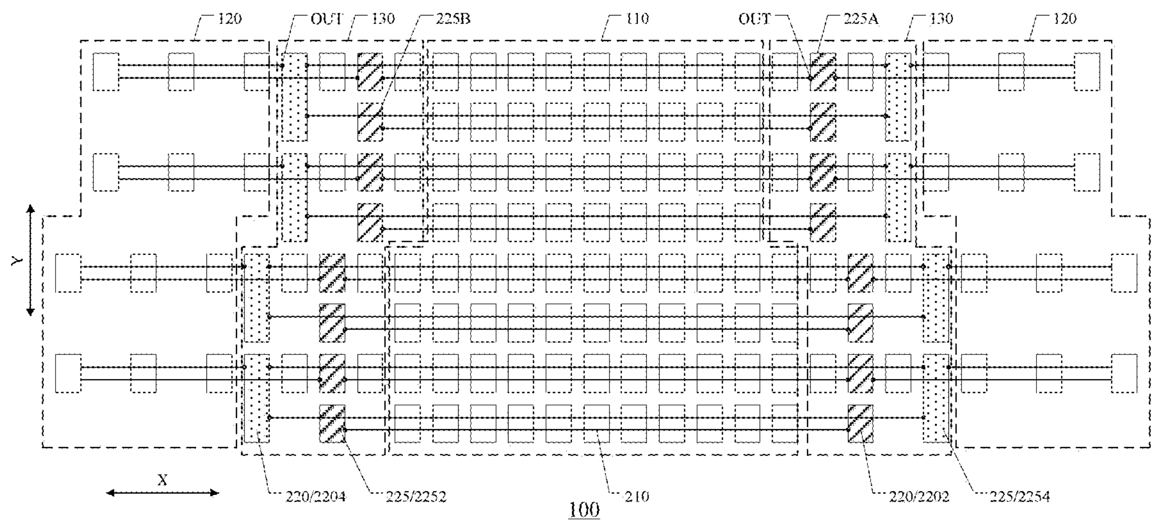
FIG. 1A is a schematic plan view of a display substrate according to an embodiment of the present disclosure.

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms “first,” “second,” etc., which are used in the present disclosure, are not intended to indicate any sequence, amount or importance, but distinguish various components. Also, the terms “comprise,” “comprising,” “include,” “including,” etc., are intended to specify that the elements or the objects stated before these terms encompass the elements or the objects and equivalents thereof listed after these terms, but do not preclude the other elements or objects.

Generally, by reducing the pixel per inch (PPI) of four corner regions of a display substrate and setting a stretchable structure with opening patterns in these four corner regions, the edges or corners of the display substrate can be bent according to a certain bending radius, thus realizing the four curved surface screen design. In this case, the greater the stretching amount of the stretchable structure located in the four corner regions, the lower the pixel per inch of these four corner regions, which is a low PPI region. On the other hand, the opening pattern of the stretchable structure needs to extend beyond the low PPI region until to the cutting line. Therefore, the gate driving circuit (GOA circuit) in the low PPI region cannot be placed outside the pixel in a conventional manner.

In this regard, embodiments of the present disclosure provide a display substrate and a display device. The display substrate includes: a first display region: a second display region, located at a side of the first display region in a first direction; and a transition region, located between the first display region and the second display region. The first display region, the second display region and the transition region are provided with a plurality of pixels, the plurality of pixels are arranged in an array in the first direction and a second direction intersecting with the second direction: a PPI of the first display region (i.e., high PPI region) is greater than a PPI of the second display region (i.e., low PPI region) and a PPI of the transition region, the transition region is further provided with a row driving circuit, the row driving circuit is configured to drive the plurality of pixels in the first display region, the second display region and the transition region by rows. Therefore, the display substrate provides a GIP (gate in pixel) design, that is, by setting the transition region between the high PPI region and the low PPI region, and setting a row driving circuit, such as gate driving circuit (GOA), in the transition region, the display substrate drives the high PPI region and the low PPI region on two sides of the transition region to display.

Hereinafter, the display substrate and the display device provided by the embodiments of the present disclosure will be described in detail with reference to the drawings.

An embodiment of the present disclosure provides a display substrate. FIG. 1A is a schematic plan view of a display substrate according to an embodiment of the present disclosure. As illustrated in FIG. 1A, the display substrate 100 includes a first display region 110, a second display region 120 and a transition region 130. The second display region 120 is located on at least one side of the first display region 110 in the first direction X, and the transition region 130 is located between the first display region 110 and the second display region 120. The first display region 110, the second display region 120 and the transition region 130 are provided with a plurality of pixels 210 arranged in an array in a first direction and a second direction intersecting with the second direction, that is, the plurality of pixels 210 form a plurality of rows and columns of pixels. The PPI of the first display region 110 is greater than the PPI of the second display region 120 and the PPI of the transition region 130. The transition region 130 is further provided with a row driving circuit 220, the row driving circuit 220 is configured to drive the plurality of pixels 210 in the first display region 110, the second display region 120 and the transition region 130 by rows. It should be noted that the transition region provided by the embodiment of the present disclosure is also provided with a plurality of pixels, and the transition region can be displayed together with the first display region and the second display region.

In the display substrate provided by the embodiment of the present disclosure, because the PPI of the first display region is greater than the PPI of the second display region and the PPI of the transition region, the first display region is a high PPI region and the second display region is a low PPI region. In this display substrate, by inserting a transition region between the high PPI region and the low PPI region, and arranging a row driving circuit in the transition region, the display substrate can drive the plurality of pixels in the first display region, the second display region and the transition region for display through the row driving circuit in the transition region by rows. Therefore, the display substrate does not need to be additionally provided with a region for placing the row driving circuit outside the low PPI region, so that the frame width of the display substrate can be reduced on the one hand, and the problem that four corner regions cannot be provided with the row driving circuit because they have been provided with opening patterns in the design of four curved surface screen can be solved on the other hand.

In some examples, as illustrated in FIG. 1A, the second display regions 120 are located at two sides of the first display region 110 in the first direction, and the two transition regions 130 are respectively located between the first display region 110 and the two second display regions 120.

In some examples, as illustrated in FIG. 1A, the row driving circuit 220 includes a plurality of row driving circuit units 225 arranged in the second direction. For example, the row driving circuit 220 can be a gate driving circuit, and the row driving circuit unit 225 can be a gate driving unit, that is, a GOA unit.

In some examples, as illustrated in FIG. 1A, the driving circuit unit 225 includes a first row driving circuit unit 225A and a second row driving circuit unit 225B: each of the two sides of the first row driving circuit unit 225A in the first direction respectively have an output terminal OUT, so that the first row driving circuit unit 225A can simultaneously drive the plurality of pixels 210 belonging to the same row in the first display region 110, the second display region 120 and the transition region 130. The side of the second row driving circuit unit 225B close to the first display region 110 in the first direction has an output terminal OUT, and the second row driving circuit unit 225 is configured to drive only the plurality of pixels 210 belonging to the same row in the first display region 110.

In the display substrate provided by the embodiment of the present disclosure, the PPI of the first display region 110 is greater than the PPI of the second display region 120, so it can happen that the number of rows of pixels 210 in the first display region 110 is greater than the number of rows of pixels 210 in the second display region 120. In this case, by setting the row driving circuit unit 225 to include the first row driving circuit unit 225A and the second row driving circuit unit 225B described above, the first row driving circuit unit 225A is configured to simultaneously drive the plurality of pixels 210 belonging to the same row in the first display region 110, the second display region 120 and the transition region 130, and the second row driving circuit unit 225 is configured to drive only the plurality of pixels 210 belonging to the same row in the first display region 110, which can better drive the pixels 210 in the first display region 110 and the second display region 120 with different PPI.

Figure 1B:
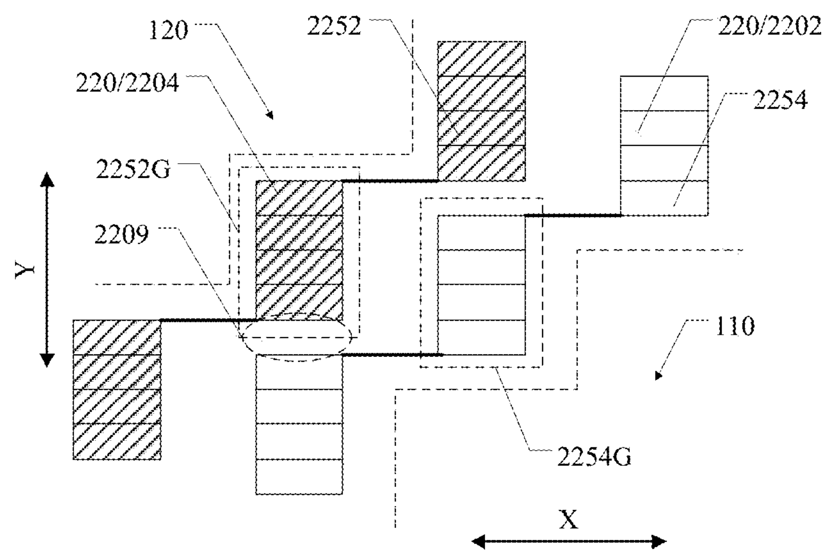
FIG. 1B is a schematic connection diagram of a row driving circuit in a display substrate according to an embodiment of the present disclosure.

FIG. 1B is a schematic connection diagram of a row driving circuit in a display substrate according to an embodiment of the present disclosure. As illustrated in FIG. 1B, the row driving circuit 220 includes a gate driving circuit 2202 and a light-emitting control driving circuit 2204. The row driving circuit unit 225 includes a gate driving unit 2252 and a light-emitting control unit 2254.

As illustrated in FIG. 1B, the gate driving circuit 2202 and the light-emitting control driving circuit 2204 are arranged in steps. A plurality of gate driving units 2252 can form a gate driving unit group 2252G, and then the orthographic projections of a plurality of gate driving unit groups 2252G in the first direction are spaced apart from each other, that is, the plurality of gate driving unit groups 2252G are arranged in a staggered way in the first direction. In this case, the plurality of gate driving units 2252 in one gate driving unit group 2252G can be cascaded with each other, and two adjacent gate driving unit groups 2252G are connected by a connection line to transmit signals such as clock signals. In the same way, a plurality of light-emitting control units 2254 can form a light-emitting control unit group 2254G, and then the orthographic projections of a plurality of light-emitting control unit groups 2254G in the first direction are spaced apart from each other, that is, the plurality of light-emitting control unit groups 2254G are arranged in a staggered way in the first direction. In this case, the plurality of light-emitting control units 2254 in one light-emitting control unit group 2254G can be cascaded with each other, and two adjacent light-emitting control unit groups 2254G are connected by a connection line to transmit signals such as clock signals.

As illustrated in FIG. 1B, because two adjacent gate driving unit groups 2252G and two adjacent light-emitting control unit groups 2254G are connected by connection lines, a gate driving unit group 2252G and a light-emitting control unit group 2254G adjacent to each other and located in the same column are spaced apart from each other, for example, spaced apart by one unit length, the unit length can be the length of one gate driving unit or one light-emitting control unit in the second direction. That is, a gap 2209 is arranged between a gate driving unit group 2252G and a light-emitting control unit group 2254G adjacent to each other and located in the same column, and the gap 2209 can provide a routing space.

Figure 1C:
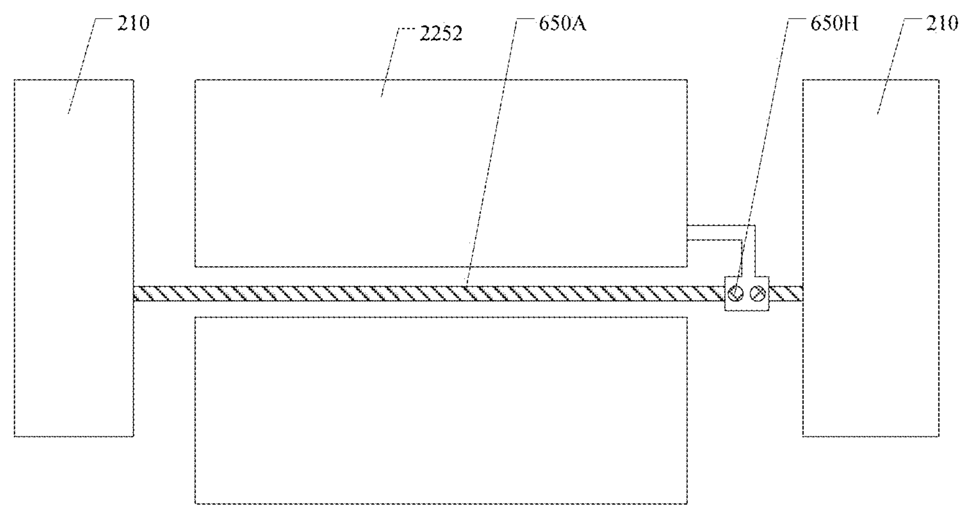
FIG. 1C is a schematic diagram of a gate driving unit in a display substrate according to an embodiment of the present disclosure.
Figure 1D:
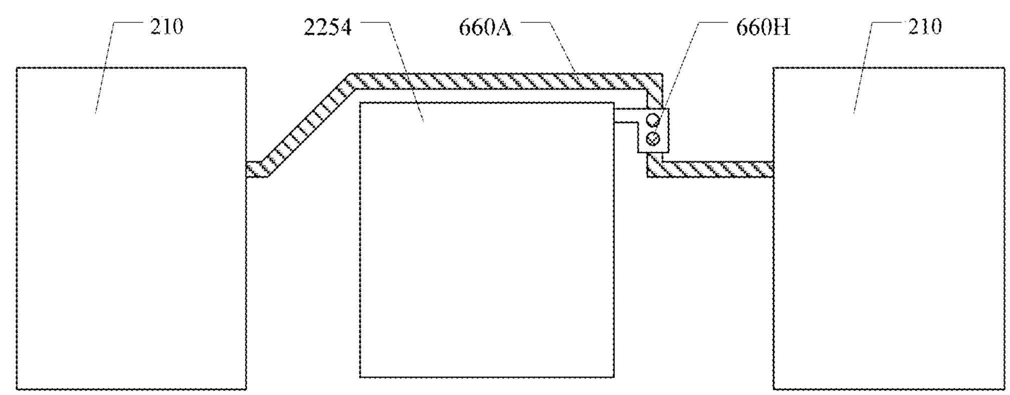
FIG. 1D is a schematic diagram of a light-emitting control unit in a display substrate according to an embodiment of the present disclosure.

FIG. 1C is a schematic diagram of a gate driving unit in a display substrate according to an embodiment of the present disclosure: FIG. 1D is a schematic diagram of a light-emitting control unit in a display substrate according to an embodiment of the present disclosure. As illustrated in FIG. 1C, the output terminal of the gate driving unit 2252 is connected with the gate line 650A through the via hole 650H, in this case, two portions of the gate line 650A located at two sides of the via hole 650H can be equivalent to two output terminals OUT of the gate driving unit 2252. As illustrated in FIG. 1D, the output terminal of the light-emitting control unit 2254 is connected with the light-emitting control line 660A through the via hole 660H, in this case, two portions of the light-emitting control line 660A located at two sides of the via hole 660H can be equivalent to two output terminals OUT of the light-emitting control unit 2254.

Figure 2:
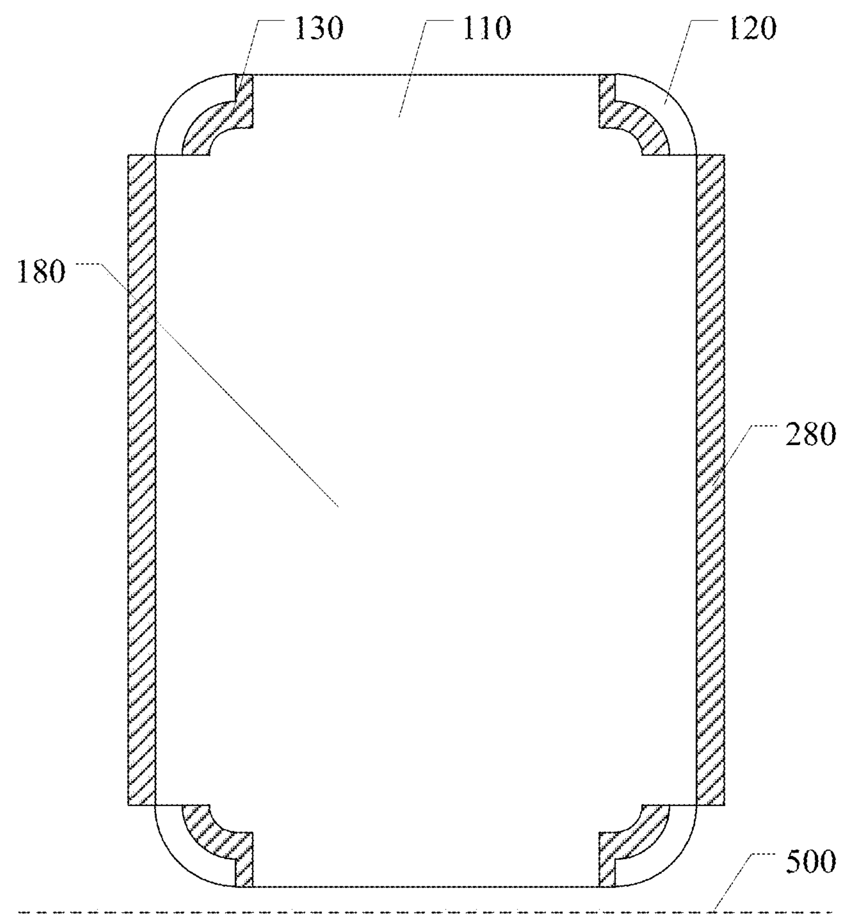
FIG. 2 is a schematic plan view of another display substrate according to an embodiment of the present disclosure.

FIG. 2 is a schematic plan view of another display substrate according to an embodiment of the present disclosure. As illustrated in FIG. 2, the planar shape of the display substrate 100 is approximately a rounded rectangle, and the four corner regions of the display substrate 100, that is, the above-mentioned second display region 120, can be bent, thereby realizing a four curved surface screen design.

In some examples, as illustrated in FIG. 2, the display substrate 100 further includes a third display region 180, the third display region 180 is provided with a plurality of pixels 210, and the PPI of the third display region 180 is approximately equal to the PPI of the first display region 110. The third display region 180 is located at a side of the first display region 110 in the second direction Y, and the orthographic projection of the third display region 180 on a reference line 500 extending in the first direction X overlaps with all of the orthographic projections of the first display region 110, the second display region 120 and the transition region 130 on the reference line 500.

For example, as illustrated in FIG. 2, the width of the orthographic projection of the third display region 180 on the reference line 500 extending in the first direction X is equal to the sum of widths of the orthographic projections of the first display region 110, the second display region 120 and the transition region 130 on the reference line 500.

In some examples, as illustrated in FIG. 2, the display substrate 100 further includes an edge driving circuit 280 located on at least one side of the third display region 180 in the first direction X. The edge driving circuit 280 is configured to drive the pixels 210 in the third display region 180.

In some examples, as illustrated in FIGS. 1A and 2, a portion of the display substrate 100 located in the second display region 120 is bent in a direction perpendicular to the first display region 110. For example, the display substrate 100 includes a light-emitting side, that is, the side where the light emitted from the display substrate 100 exits, and the portion of the display substrate 100 located in the second display region 120 can be bent to a side opposite to the light-emitting side, thereby realizing a curved 3D stereoscopic effect, thereby creating a stereoscopic immersion feeling.

In some examples, the second display region 120 can be provided with an opening pattern so as to be stretched and bent, while neither the first display region 110 nor the transition region 130 is provided with an opening pattern.

Figure 3:
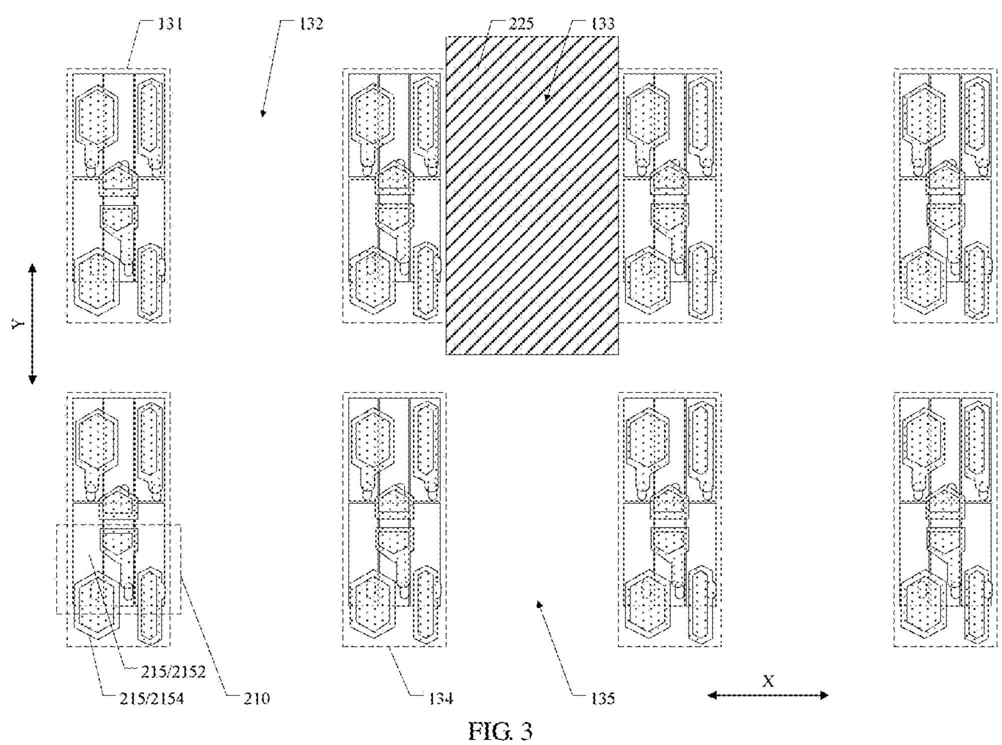
FIG. 3 is a schematic plan view of another display substrate according to an embodiment of the present disclosure.

FIG. 3 is a schematic plan view of another display substrate according to an embodiment of the present disclosure. As illustrated in FIG. 3, in the transition region 130, the pixel 210 can include a plurality of sub-pixels 215, and each of the plurality sub-pixels 215 includes a pixel driving circuit 2152 and a driving electrode 2154 electrically connected with the pixel driving circuit 2152. In this case, the transition region 130 includes a plurality of pixel circuit islands 131, a plurality of first spacing regions 132 and at least one driving spacing region 133.

As illustrated in FIG. 3, each of the plurality of pixel circuit islands 131 is provided with a plurality of pixel driving circuits 2152 of at least one of the plurality of pixels 210; FIG. 3 illustrates that six pixel driving circuits 2152 of two pixels 210 adjacent in the second direction are arranged in one pixel circuit island 131. It should be noted that the shortest distance between pixel driving circuits in the above pixel circuit islands is less than the shortest distance between two adjacent pixel circuit islands. In addition, although FIG. 3 illustrates that the pixel circuit island includes pixel driving circuits of two pixels, embodiments of the present disclosure include but are not limited thereto, and the pixel circuit island can be provided with pixel driving circuits of more pixels.

As illustrated in FIG. 3, each first spacing region 132 is located between two pixel circuit islands 131 adjacent in the first direction, each driving spacing region 133 is also located between two pixel circuit islands 131 adjacent in the first direction, and the driving spacing region 133 is provided with a row driving circuit unit 225. In this display substrate, the transition region 130 can be divided into a pixel circuit island 131, a first spacing region 132 and a driving spacing region 133. The driving spacing region 133 is located between two pixel circuit islands 131 adjacent in the first direction and is provided with the row driving circuit unit 225. Therefore, the display substrate can be provided with a pixel driving circuit 2152 on the pixel circuit island 131 for applying data signals to the driving sub-pixels 215, and a row driving circuit unit 225 on the driving spacing region 133 for applying row driving signals to the row driving circuit unit 225.

For example, when the above-mentioned display substrate is an organic light-emitting diode display substrate, the above-mentioned driving electrode can be an anode: of course, embodiments of the present disclosure include but are not limited thereto.

In some examples, as illustrated in FIG. 3, the transition region 130 further includes a plurality of driving electrode islands 134 and a plurality of second spacing regions 135. The plurality of driving electrode islands 134 are arranged corresponding to the plurality of pixel circuit islands 131, and each of the plurality of driving electrode islands 138 is provided with a plurality of driving electrodes 2154 of at least one pixel 210. For example, when one pixel 210 includes three sub-pixels 215 (e.g., a red sub-pixel, a blue sub-pixel and a green sub-pixel), each of the plurality of driving electrode islands 138 can be provided with three driving electrodes 2154. Each second spacing region 135 is located between two driving electrode islands 134 adjacent in the first direction. It should be noted that the driving electrode island and the pixel circuit island respectively belong to different film layers of the display substrate, so they can overlap with each other.

In some examples, as illustrated in FIG. 3, the plurality of first spacing regions 132 have equal widths in the first direction, the plurality of second spacing regions 135 have equal widths in the first direction, and the width of each of the first spacing regions 132 in the first direction and the width of each of the driving spacing regions 133 in the first direction are equal. In this display substrate, because the widths of the plurality of second spacing regions 135 in the first direction are equal, the driving electrode islands 134 in the first direction are also equidistantly distributed, thereby ensuring that the pixels in the transition region emit light uniformly without defects such as bright lines or dark lines. On the other hand, the width of the first spacing region 132 that is not provided with the row driving circuit unit 225 between two pixel circuit islands 131 adjacent in the first direction is the same as the width of the driving spacing region 133 that is provided with the row driving circuit unit 225 between two pixel circuit islands 131 adjacent in the first direction. In this case, the pixel circuit islands 131 in the first direction are equidistantly distributed. Therefore, the display substrate has the advantages of simple layout and the like at the same time that the pixels in the transition region emit light relatively uniformly, and there will be no defects such as bright lines or dark lines.

Figure 4:
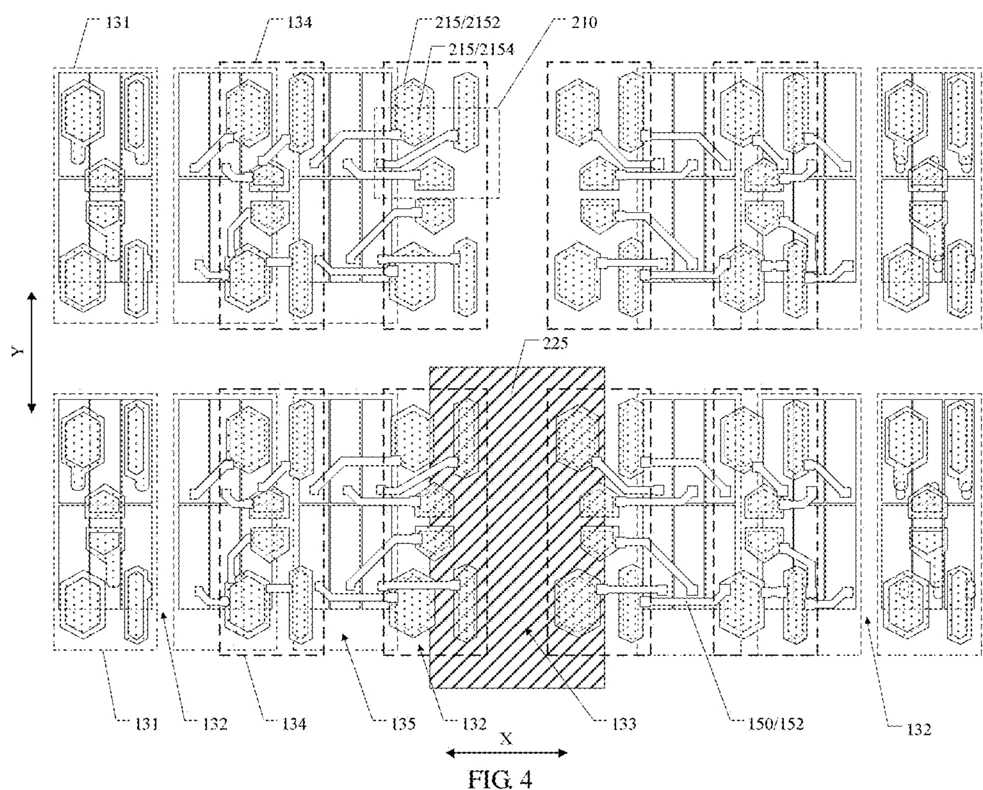
FIG. 4 is a schematic plan view of another display substrate according to an embodiment of the present disclosure.

FIG. 4 is a schematic plan view of another display substrate according to an embodiment of the present disclosure. As illustrated in FIG. 4, the plurality of first spacing regions 132 (i.e., spacing regions between adjacent pixel circuit islands 131 except driving spacing regions 133) have equal widths in the first direction, and the plurality of second spacing regions 135 (i.e., spacing regions between adjacent driving electrode islands 134) have equal widths in the first direction, the width of each of the second spacing regions 135 in the first direction is less than the width of each of the driving spacing regions 133 in the first direction, the width of each of the first spacing regions 132 in the first direction is less than the width of each of the driving spacing regions 133 in the first direction. In this display substrate, the widths of the plurality of second spacing regions 135 in the first direction are equal, so that the pixels in the transition region can emit light uniformly, and there are no defects such as bright lines or dark lines. On the other hand, what is different from the display substrate illustrated in FIG. 3 is, the pixel circuit islands 131 in the first direction are not equidistantly arranged, and the width of the first spacing region 132 that is not provided with the row driving circuit unit 225 between two pixel circuit islands 131 adjacent in the first direction is less than the width of the driving spacing region 133 that is provided with the row driving circuit unit 225 between two pixel circuit islands 131 adjacent in the first direction. Therefore, the display substrate can increase the width of the driving spacing region 133 by reducing the width of the first spacing region 132 when the size of the transition region in the first direction or the PPI of the transition region is large, so that the driving spacing region 133 can accommodate the row driving circuit unit 225. Therefore, the display substrate can ensure that the pixels in the transition region emit light uniformly, and the transition region still has a higher PPI, thus having a better display quality. It should be noted that, in the display substrate illustrated in FIG. 4, the corresponding pixel circuit island and driving electrode island are not aligned, so it is needed to use a connection electrode to connect the output terminals of the corresponding pixel circuit islands with the driving electrodes in the driving electrode islands.

In some examples, the width of the first spacing region 132 in the first direction is 0.5-1.5 times of the width of the driving spacing region 133 in the first direction, so that the transition region still has a high PPI on the premise of ensuring pixel in the transition region emit light uniformly, thus having a better display quality.

In some examples, as illustrated in FIG. 4, the display substrate 100 further includes a plurality of connection electrode structures 150 located between the plurality of pixel circuit islands 131 and the plurality of driving electrode islands 134 in a direction perpendicular to the transition region 130, that is, the plurality of connection electrode structures 150 are located at a side of the driving electrode islands 131 close to the pixel circuit islands 131 in the direction perpendicular to the transition region 130. The plurality of connection electrode structures 150 are respectively arranged in one-to-one correspondence with the plurality of driving electrode islands 134 and the plurality of pixel circuit islands 131, and each of the plurality of connection electrode structures 150 includes a plurality of connection electrodes 152 to electrically connect the plurality of pixel driving circuits 2152 in a corresponding pixel circuit island 131 with the plurality of driving electrodes 2154 in a corresponding driving electrode island 134.

In some examples, as illustrated in FIG. 4, a pixel 210 includes three sub-pixels 215, and in this case, a connection electrode structure 150 can include three connection electrodes 152, thereby respectively electrically connecting three pixel driving circuits 2152 and three driving electrodes 2154 in the corresponding pixel 210.

Figure 5:
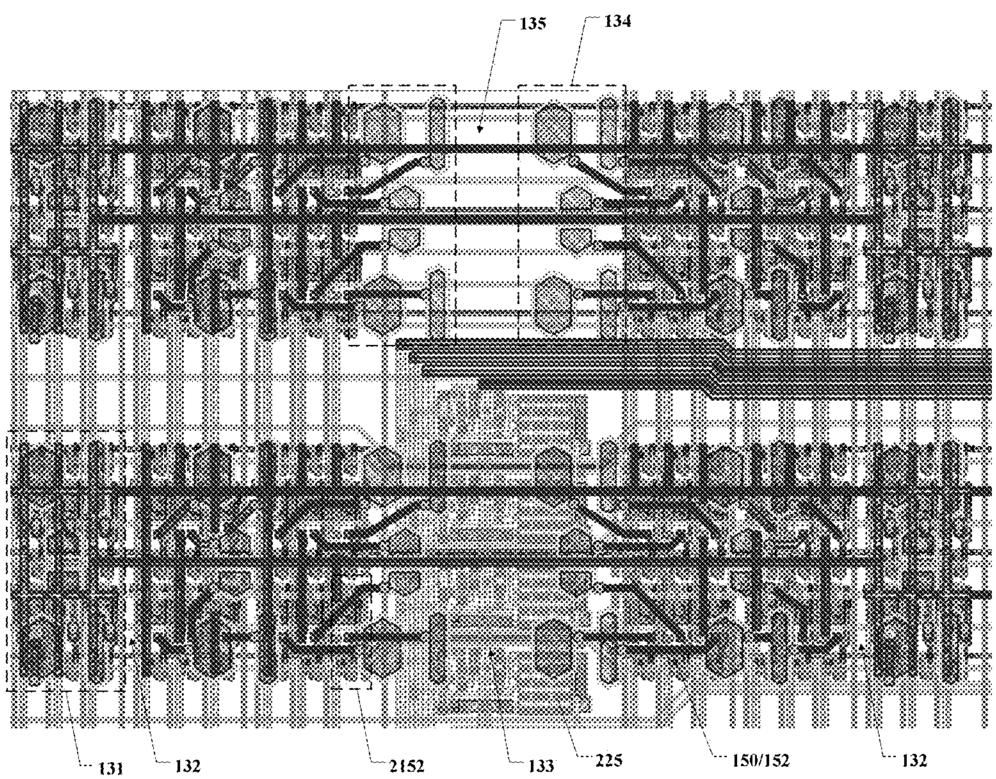
FIG. 5 is a schematic plan view of another display substrate according to an embodiment of the present disclosure.

FIG. 5 is a schematic plan view of another display substrate according to an embodiment of the present disclosure. As illustrated in FIG. 5, the pixel driving unit 2152 includes a driving transistor 2152T, and the orthographic projection of the driving transistor 2152T on a film layer where the corresponding driving electrode 1254 is located is spaced apart from the corresponding driving electrode 2154. In the display substrate provided by the embodiment of the present disclosure, the pixel circuit islands 131 and the driving electrode islands 134 are not aligned, so that the orthographic projection of the driving transistor 2152T on a film layer where the corresponding driving electrode 1254 is located is spaced apart from the corresponding driving electrode 2154.

Figure 6:
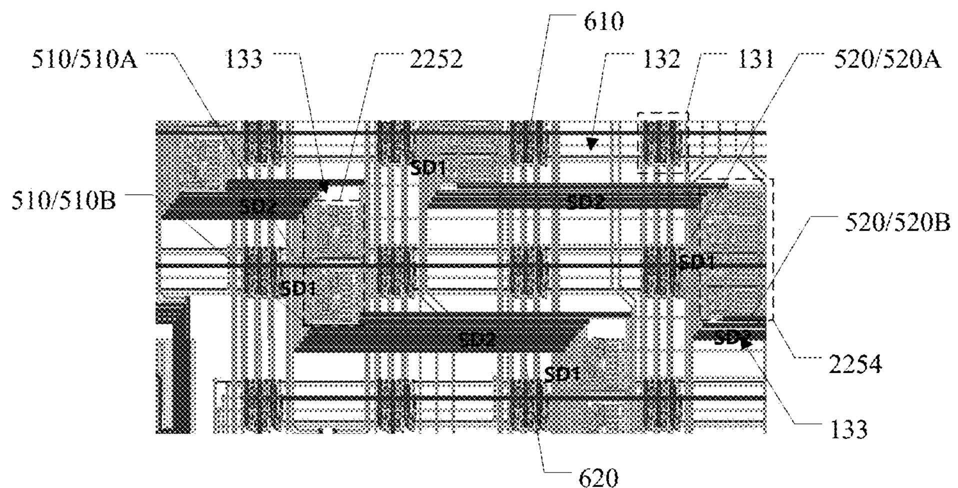
FIG. 6 is a schematic plan view of another display substrate according to an embodiment of the present disclosure.

FIG. 6 is a schematic plan view of another display substrate according to an embodiment of the present disclosure. As illustrated in FIG. 6, the row driving circuit 220 includes a gate driving circuit 2202 and a light-emitting control driving circuit 2204, and the row driving circuit unit 225 includes a gate driving unit 2252 and a light-emitting control unit 2254. At least one driving spacing region 133 includes two driving spacing regions 133, that is, the number of driving spacing regions 133 between a row of pixels 210 in the transition region 130 is two. In this case, one of the two driving spacing regions 133 is provided with the gate driving unit 2252, and the other of the two driving spacing regions 133 is provided with the light-emitting control unit 2254. Of course, the embodiments of the present disclosure include but are not limited thereto, and the row driving circuit unit can further include other circuit units that apply signals in the row direction: in addition, the gate driving unit and the light-emitting control unit can also be simultaneously arranged in one driving spacing region.

In some examples, as illustrated in FIG. 6, the two driving spacing regions 133 are spaced apart from each other by at least two first spacing regions 132. Therefore, the display substrate can avoid uneven light-emitting caused by small distance of the driving spacing regions 133. Furthermore, the distance between two driving spacing regions 133 being relatively long is also convenient for wiring.

In some examples, as illustrated in FIG. 6, the display substrate 100 further includes a plurality of first driving lines 510 configured to drive a plurality of gate driving units 2252, and the plurality of gate driving units 2252 are arranged in a staggered way in the first direction. Each of the plurality of first driving lines 510 includes a first portion 510A extending in the second direction and a second portion 510B extending in the first direction, the first portion 510A is connected with the corresponding gate driving unit 2252, and the second portion 510B connects the first portions 510A of two adjacent gate driving units 2252.

In some examples, as illustrated in FIG. 6, the display substrate 100 further includes a data line 610, the first portion 510A and the data line 610 are located on a first source-drain metal layer SD1, and the second portion 510B is located on a second source-drain metal layer SD2.

In some examples, as illustrated in FIG. 6, each of the plurality of first driving lines 510 is arranged in steps.

In some examples, as illustrated in FIG. 6, the display substrate 100 further includes a plurality of second driving lines 520 configured to drive a plurality of light-emitting control units 2254, and the plurality of light-emitting control units 2254 are arranged in a staggered way in the first direction. Each of the plurality of second driving lines 520 includes a third portion 520A extending in the second direction and a fourth portion 520B extending in the first direction, the third portion 520A is connected with the corresponding light-emitting control unit 2254, and the fourth portion 520B connects the third portions 520A of two adjacent light-emitting control units 2254.

In some examples, as illustrated in FIG. 6, the display substrate includes a data line 610, the third portion 520A and the data line 610 are located on the first source-drain metal layer SD1, and the fourth portion is located on the second source-drain metal layer SD2.

In some examples, as illustrated in FIG. 6, each of the plurality of second driving lines 520 is arranged in steps.

Figure 7:
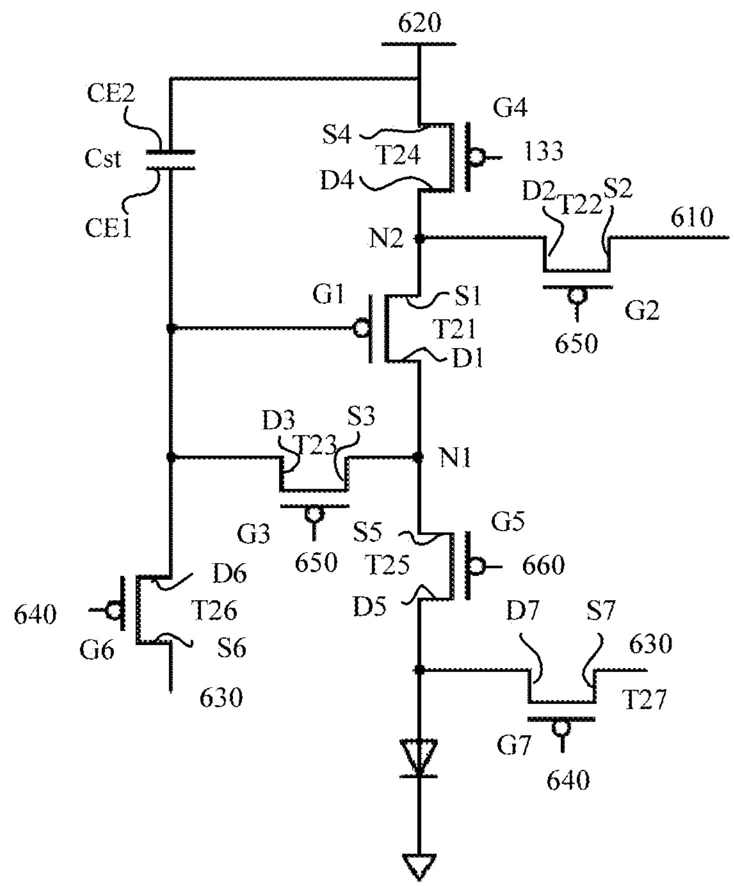
FIG. 7 is an equivalent schematic diagram of a pixel driving circuit in a display substrate according to an embodiment of the present disclosure.

FIG. 7 is an equivalent schematic diagram of a pixel driving circuit in a display substrate according to an embodiment of the present disclosure. As illustrated in FIG. 7, the pixel driving circuit 2152 includes a first thin film transistor T21, a second thin film transistor T22, a third thin film transistor T23, a fourth thin film transistor T24, a fifth thin film transistor T25, a sixth thin film transistor T26, a seventh thin film transistor T27 and a storage capacitor Cst. The first thin film transistor T21 includes a first gate electrode G1 and a first source electrode S1 and a first drain electrode D1 on two sides of the first gate electrode G1, the second thin film transistor T22 includes a second gate electrode G2 and a second source electrode S2 and a second drain electrode D2 on two sides of the second gate electrode G2, the third thin film transistor T23 includes a third gate electrode G3 and a third source electrode S3 and a third drain electrode D3 on two sides of the third gate electrode G3, the fourth thin film transistor T24 includes a fourth gate electrode G4 and a fourth source electrode S4 and a fourth drain electrode D4 on two sides of the fourth gate electrode G4, the fifth thin film transistor T25 includes a fifth gate electrode G5 and a fifth source electrode S5 and a fifth drain electrode D5 on two sides of the fifth gate electrode G5, the sixth thin film transistor T26 includes a sixth gate electrode G6 and a sixth source electrode S6 and a sixth drain electrode D6 on two sides of the sixth gate electrode G6, and the seventh thin film transistor T27 includes a seventh gate electrode G7 and a seventh source electrode S7 and a seventh drain electrode D7 on two sides of the seventh gate electrode G7. The storage capacitor Cst includes a first electrode block CE1 and a second electrode block CE2. It should be noted that the pixel driving circuit illustrated in FIG. 7 adopts a 7T1C structure. However, embodiments of the present disclosure include but are not limited thereto, and the pixel driving circuit can also adopt other circuit structures.

For example, as illustrated in FIG. 7, the reset signal line 640 is connected with the gate electrode G6 of the sixth thin film transistor T26; the sixth drain electrode D6 is connected with the third drain electrode D3, the third source electrode S3, the first drain electrode D1 and the fifth source electrode S5 are connected with the first node N1, the first source electrode S1, the second drain electrode D2 and the fourth drain electrode D4 are connected with the second node N2, and the fifth drain electrode D5 is connected with the seventh drain electrode D7. The sixth source electrode S6 and the seventh source electrode S7 are connected with the initialization signal line 630, and the second source electrode S2 can be connected with the data line 610. The fourth source electrode S4 is connected with the power line 620, the gate line 650 is connected with the third gate electrode G of the third thin film transistor T23, and the light-emitting control line 660 is connected with the fifth gate electrode G5.

Hereinafter, an operation mode of the pixel driving circuit illustrated in FIG. 7 will be schematically described. First, when a reset signal is transmitted to the reset signal line 640 and the seventh thin film transistor T7 is turned on, the residual current flowing through the anode of each of the plurality sub-pixels is discharged to the sixth thin film transistor T6 through the seventh thin film transistor T7, so that light-emitting due to the residual current flowing through the anode of each of the plurality sub-pixels can be suppressed. Then, when a reset signal is transmitted to the reset signal line 640 and an initialization signal is transmitted to the initialization signal line 630, the sixth thin film transistor T6 is turned on, and an initialization voltage Vint is applied to the first gate electrode G1 of the first thin film transistor T1 and the first electrode block CE1 of the storage capacitor Cst through the sixth thin film transistor T6, so that the first gate electrode G1 and the storage capacitor Cst are initialized. Initialization of the first gate electrode G1 can turn on the first thin film transistor T1.

Then, when a gate signal is transmitted to the gate line 650 and a data signal is transmitted to the data line 610, both the second thin film transistor T2 and the third thin film transistor T3 are turned on, and a data voltage Vd is applied to the first gate electrode G1 through the second thin film transistor T2 and the third thin film transistor T3. In this case, the voltage applied to the first gate electrode G1 is a compensation voltage Vd+Vth, and the compensation voltage applied to the first gate electrode G1 is also applied to the first electrode block CE1 of the storage capacitor Cst.

Thereafter, the power line 620 applies a driving voltage Ve1 to the second electrode block CE2 of the storage capacitor Cst, and applies a compensation voltage Vd+Vth to the first electrode block CE1, so that charges corresponding to differences between voltages respectively applied to the two electrodes of the storage capacitor Cst are stored in the storage capacitor Cst, and the first thin film transistor T1 is turned on for a predetermined time.

Subsequently, when a light-emitting control signal is applied to the light-emitting control line 660, both the fourth thin film transistor T4 and the fifth thin film transistor T5 are turned on, so that the fourth thin film transistor T4 applies a driving voltage Ve1 to the fifth thin film transistor T5. When the driving voltage Ve1 passes through the first thin film transistor T1 turned on by the storage capacitor Cst, the difference between the corresponding driving voltage Ve1 and the voltage applied to the first gate electrode G1 through the storage capacitor Cst causes a driving current Id to flow through the first drain region D3 of the first thin film transistor T1, and the driving current Id is applied to each of the plurality sub-pixels through the fifth thin film transistor T5, so that the light-emitting layer of each of the plurality sub-pixels emits light.

Figure 8:
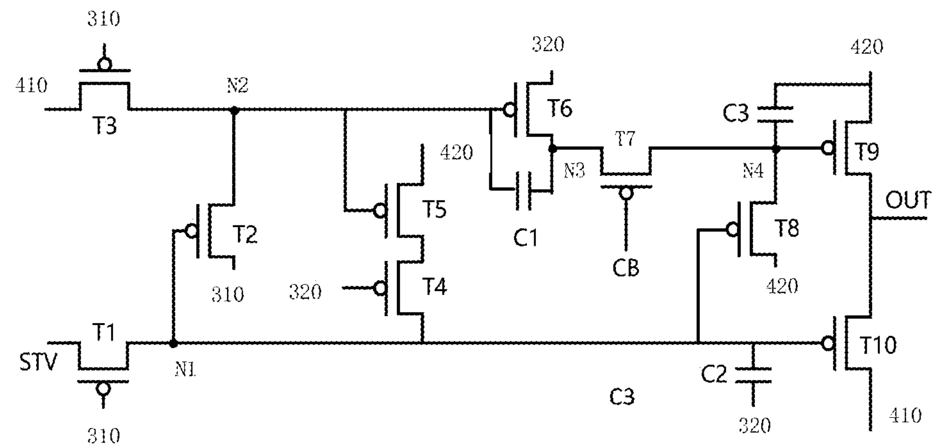
FIG. 8 is an equivalent circuit diagram of a light-emitting control unit according to an embodiment of the present disclosure.

FIG. 8 is an equivalent circuit diagram of a light-emitting control unit according to an embodiment of the present disclosure. As illustrated in FIG. 8, the light-emitting control unit includes: a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10 (also called output transistor), a first capacitor C1, a second capacitor C2 and a third capacitor C3. This light-emitting control unit adopts a 10T3C structure, of course, embodiments of the present disclosure include but are not limited thereto. It should be noted that the above-mentioned light-emitting control unit is a light-emitting control shift register. When a plurality of light-emitting control shift registers are cascaded, the second electrode of the first transistor T1 in the first-stage light-emitting control shift register can be connected with an input terminal, the input terminal is configured to be connected with a trigger signal line STV to receive a trigger signal as an input signal. While the second electrode of the first transistor T1 in other stages of light-emitting control shift register units is electrically connected with the output terminal of the previous stage of light-emitting control shift register unit to receive the output signal output by the output terminal OUT of the previous stage of light-emitting control shift register unit as an input signal, thereby realizing shift output to provide light-emitting control signals, such as row-by-row shift, to the pixels arranged in an array in a display region of a display substrate.

As illustrated in FIG. 8, the gate electrode of the first transistor T1 is connected with the first clock signal line 310 to receive the first clock signal, the first electrode of the first transistor T1 is connected with the first node N1, and the second electrode of the first transistor T1 is connected with the input terminal. For example, when the light-emitting control unit is a first-stage light-emitting control unit, the input terminal is connected with the trigger signal line STV to receive the trigger signal, and when the light-emitting control unit is a light-emitting control unit of other stages except the first-stage light-emitting control unit, the input terminal is connected with the output terminal OUT of its previous stage light-emitting control unit.

As illustrated in FIG. 8, the gate electrode of the second transistor T2 is connected with the first node N1, the first electrode of the second transistor T2 is connected with the second node N2, and the second electrode of the second transistor T2 is connected with the first clock signal line 310 to receive the first clock signal.

As illustrated in FIG. 8, the gate electrode of the third transistor T3 is connected with the first clock signal line 310 to receive the first clock signal, the first electrode of the third transistor T3 is connected with the second node N2, and the second electrode of the third transistor T3 is connected with the first power line 410 to receive the first voltage.

As illustrated in FIG. 8, the gate electrode of the fourth transistor T4 is connected with the second clock signal line 320 to receive the second clock signal, the first electrode of the fourth transistor T4 is connected with the first node N1, and the second electrode of the fourth transistor T4 is connected with the second electrode of the fifth transistor T5.

As illustrated in FIG. 8, the gate electrode of the fifth transistor T5 is connected with the second node N2, and the first electrode of the fifth transistor T5 is connected with the second power line 420 to receive the second voltage.

As illustrated in FIG. 8, the first electrode of the sixth transistor T6 is connected with the second clock signal line 320 to receive the second clock signal, and the second electrode of the sixth transistor T6 is connected with the third node N3.

As illustrated in FIG. 8, the gate electrode of the seventh transistor T7 is connected with the second clock signal line 320 to receive the second clock signal, the first electrode of the seventh transistor T7 is connected with the third node N3, and the second electrode of the seventh transistor T7 is connected with the fourth node N4.

As illustrated in FIG. 8, the gate electrode of the eighth transistor T8 is connected with the first node N1, the first electrode of the eighth transistor T8 is connected with the fourth node N4, and the second electrode of the eighth transistor T8 is connected with the second power line 420 to receive the second voltage.

As illustrated in FIG. 8, the gate electrode of the ninth transistor T9 is connected with the fourth node N4, the first electrode of the ninth transistor T9 is connected with the second power line 420 to receive the second voltage, and the second electrode of the ninth transistor T9 is connected with the output terminal.

As illustrated in FIG. 8, the first electrode of the tenth transistor T10 is connected with the first power line 410 to receive the first voltage, and the second electrode of the tenth transistor T10 is connected with the output terminal.

As illustrated in FIG. 8, the second electrode of the first capacitor C1 is connected with the third node N3: the second electrode of the second capacitor C2 is connected with the second clock signal line 320 to receive the second clock signal: the first electrode of the third capacitor C3 is connected with the fourth node N4, and the second electrode of the third capacitor C3 is connected with the second power line 420 to receive the second voltage.

It should be noted that the transistors in the light-emitting control unit illustrated in FIG. 8 are all explained by taking p-type transistors as an example, that is, each transistor is turned on when the gate is turned on at a low level (on level) and turned off when it is turned on at a high level (off level). In this case, the first electrode of the transistor can be a source electrode, and the second electrode of the transistor can be a drain electrode. Of course, the embodiments of the present disclosure include but are not limited thereto, and each transistor can also adopt an n-type transistor or a mixture of p-type transistors and n-type transistors, as long as the polarities of the electrodes of the selected transistors are connected according to the polarities of the electrodes of the corresponding transistors in the embodiments of the present disclosure. In addition, the working principle of the light-emitting control unit can refer to the relevant introduction in this field, and will not be repeated here.

It should be noted that all the transistors used in the light-emitting control unit can be thin film transistors, field effect transistors or other switching devices with the same characteristics. Here, the thin film transistors are taken as examples. For example, the active layer (channel region) of the transistor uses semiconductor materials, such as poly-silicon (such as low-temperature poly-silicon or high-temperature poly-silicon), amorphous silicon, indium gallium zinc oxide (IGZO), etc., while the gate electrode, source electrode and drain electrode use metal materials, such as metal aluminum or aluminum alloy. The source electrode and drain electrode of the transistor used here can be symmetrical in structure, so there can be no difference in structure between the source electrode and drain electrode. In the embodiment of the present disclosure, in order to distinguish the two electrodes of the transistor except the gate electrode, it is directly described that one electrode is the first electrode and the other electrode is the second electrode. In addition, in the embodiment of the present disclosure, the electrode of the capacitor can be a metal electrode or one of the electrodes can be a semiconductor material (e.g., doped poly-silicon).

In some examples, the orthographic projections of the ninth transistor T9 and the tenth transistor T10 on the film layer, where the plurality of connection electrode structures 150 are located, are spaced apart from the plurality of connection electrode structures, so that the signal on the connection electrode structures 150 can be prevented from affecting the light-emitting control unit. Because the channel width/length ratios (W/L) of the ninth transistor T9 and the tenth transistor T10 are large, by arranging the orthographic projections of the ninth transistor T9 and the tenth transistor T10 on the film layer where the plurality of connection electrode structures 150 are located spaced apart from the plurality of connection electrode structures 150, the connection electrode structures can be prevented from influencing the ninth transistor T9 and the tenth transistor T10, and the problems such as display brightness difference and color shift after the pixel emits light can be improved.

Figure 9:
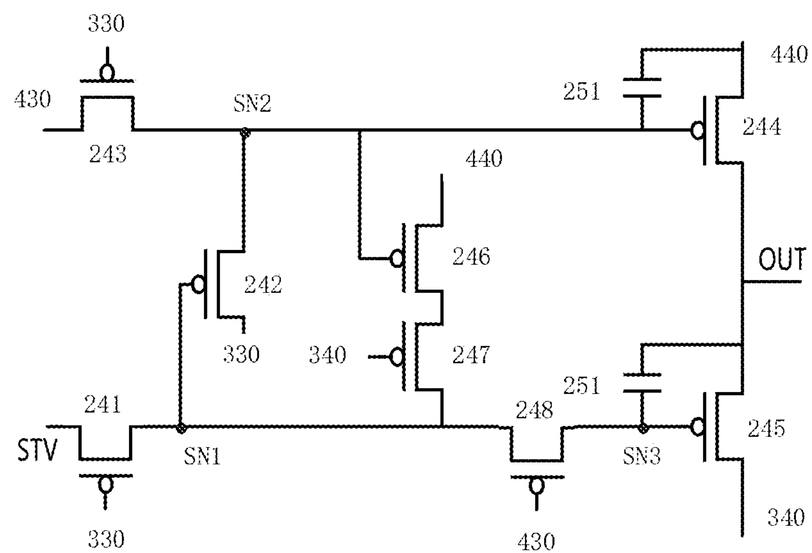
FIG. 9 is an equivalent circuit diagram of a gate driving unit according to an embodiment of the present disclosure.

FIG. 9 is an equivalent circuit diagram of a gate driving unit according to an embodiment of the present disclosure. As illustrated in FIG. 9, the gate driving unit 2252 includes an input transistor 241, a first control transistor 242, a second control transistor 243, an output control transistor 244, a gate output transistor 245, a first noise reduction transistor 246, a second noise reduction transistor 247, a voltage stabilizing transistor 248, a first scanning capacitor 251 and a second scanning capacitor 252. Therefore, the gate driving unit can adopt an 8T2C structure, although embodiments of the present disclosure include but are not limited thereto, and the gate driving unit can also adopt other circuit structures.

It should be noted that the above-mentioned gate driving unit is a gate scanning shift register. When a plurality of gate driving units are cascaded, the first electrode of the input transistor T1 in the first-stage gate driving unit is connected with the input terminal, the input terminal is configured to be connected with the trigger signal line STV to receive the trigger signal as an input signal, while the first electrode of the input transistor T1 in other stages of gate driving units is electrically connected with the output terminal of the previous-stage gate driving unit to receive the output signal output by the output terminal OUT of the previous-stage gate driving unit as an input signal, thereby realizing shift output for scanning pixels in the display substrate line by line.

As illustrated in FIG. 9, the gate electrode of the input transistor 241 is connected with the third clock signal line 330, the second electrode of the input transistor 241 is connected with the input terminal, and the first electrode of the input transistor 241 is connected with the first scanning node SN1.

As illustrated in FIG. 9, the gate electrode of the first control transistor 242 is connected with the first scanning node SN1, the second electrode of the first control transistor 242 is connected with the third clock signal line 330, and the first electrode of the first control transistor 242 is connected with the second scanning node SN2.

As illustrated in FIG. 9, the gate electrode of the second control transistor 243 is connected with the third clock signal line 330, the second electrode of the second control transistor 243 is connected with the third power line 430, and the first electrode of the second control transistor 243 is connected with the second scanning node SN2.

As illustrated in FIG. 9, the gate electrode of the output control transistor 244 is connected with the second scanning node SN2, the first electrode of the output control transistor 244 is connected with the fourth power line 440, and the second electrode of the output control transistor 245 is connected with the output terminal.

As illustrated in FIG. 9, the first electrode of the first scanning capacitor 251 is connected with the second scanning node SN2, and the second electrode of the first scanning capacitor 251 is connected with the fourth power line 440.

As illustrated in FIG. 9, the gate electrode of the gate output transistor 245 is connected with the third scanning node SN3, the first electrode of the gate output transistor 245 is connected with the fourth clock signal line 340, and the second electrode of the gate output transistor 245 is connected with the output terminal.

As illustrated in FIG. 9, the first electrode of the second scanning capacitor 252 is connected with the third scanning node SN3, and the second electrode of the second scanning capacitor 252 is connected with the output terminal.

As illustrated in FIG. 9, the gate electrode of the first noise reduction transistor 246 is connected with the second scanning node SN2, the first electrode of the first noise reduction transistor 246 is connected with the fourth power line 440, and the second electrode of the first noise reduction transistor 246 is connected with the second electrode of the second noise reduction transistor 247.

As illustrated in FIG. 9, the gate electrode of the second noise reduction transistor 247 is connected with the fourth clock signal line 340, and the first electrode of the second noise reduction transistor 247 is connected with the first scanning node SN1.

As illustrated in FIG. 9, the gate electrode of the voltage stabilizing transistor 248 is connected with the third power line 430, the second electrode of the voltage stabilizing transistor 248 is connected with the first scanning node SN1, and the first electrode of the voltage stabilizing transistor 248 is connected with the third scanning node SN3.

It should be noted that the transistors in the gate driving unit illustrated in FIG. 9 are all explained by taking p-type transistors as an example, that is, each transistor is turned on (on level) when the gate is connected with a low level, and turned off (off level) when the gate is connected with a high level. In this case, the first electrode of the transistor can be a source electrode, and the second electrode of the transistor can be a drain electrode. Of course, the embodiments of the present disclosure include but are not limited thereto, and each transistor can also adopt an n-type transistor or a mixture of p-type transistors and n-type transistors, as long as the polarities of the electrodes of the selected transistors are connected according to the polarities of the electrodes of the corresponding transistors in the embodiments of the present disclosure. In addition, the working principle of the gate driving unit can refer to the relevant introduction in this field, and will not be repeated here.

It should be noted that all the transistors used in the gate driving unit can be thin film transistors, field effect transistors or other switching devices with the same characteristics. Here, thin film transistors are taken as examples. For example, the active layer (channel region) of the transistor uses semiconductor materials, such as poly-silicon (such as low-temperature poly-silicon or high-temperature poly-silicon), amorphous silicon, indium gallium zinc oxide (IGZO), etc., while the gate electrode, source electrode and drain electrode use metal materials, such as metal aluminum or aluminum alloy. The source electrode and drain electrode of the transistor used here can be symmetrical in structure, so there can be no difference in structure between the source electrode and drain electrode. In the embodiment of the present disclosure, in order to distinguish the two electrodes of the transistor except the gate electrode, it is directly described that one electrode is the first electrode and the other electrode is the second electrode. In addition, in the embodiment of the present disclosure, the electrode of the capacitor can be a metal electrode or one of the electrodes can be a semiconductor material (e.g., doped poly-silicon).

In some examples, the orthographic projections of the output control transistor 244 and the gate output transistor 245 on the film layer, where the plurality of connection electrode structures 150 are located, are spaced apart from the plurality of connection electrode structures 150. Because the channel width-length ratios (W/L) of the output control transistor 244 and the gate output transistor 245 are large, by arranging the orthographic projections of the output control transistor 244 and the gate output transistor 245 on the film layer where the plurality of connection electrode structures 150 are located spaced apart from the plurality of connection electrode structures 150, the connection electrode structures can be prevented from influencing the output control transistor 244 and the gate output transistor 245, so that the problems such as display brightness difference and color shift after the pixel emits light can be improved.

Figure 10:
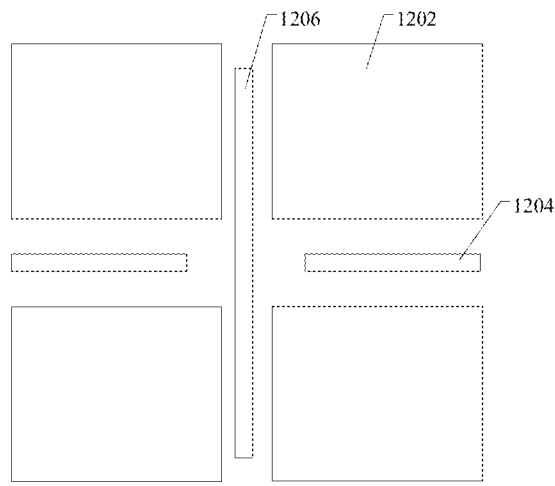
FIG. 10 is a schematic diagram of a second display region on a display substrate according to an embodiment of the present disclosure.

FIG. 10 is a schematic diagram of a second display region on a display substrate according to an embodiment of the present disclosure. As illustrated in FIG. 10, the second display region 120 includes: a plurality of pixel islands 1202, arranged in an array in a first direction and a second direction, and each of the plurality of pixels island 1202 includes at least one pixel: a first opening 1204, extending in the first direction and located between two pixel islands 1202 adjacent in the second direction; and a second opening 1206, extending in the second direction and located between two pixel islands 1202 adjacent in the first direction. Because the second display region is provided with the first opening and the second opening, that is, the above-mentioned opening pattern, bending and stretching can be facilitated.

Figure 11:
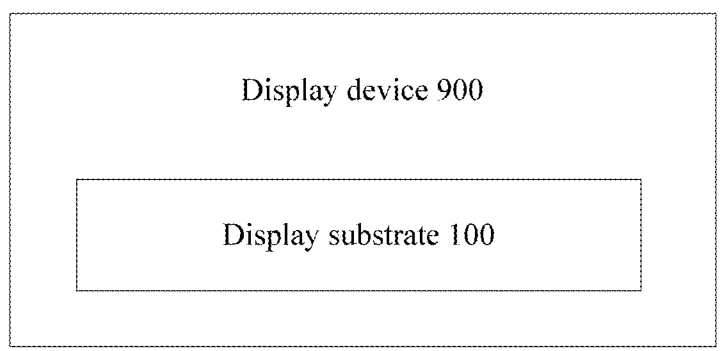
FIG. 11 is a schematic plan view of a display substrate according to an embodiment of the present disclosure.

At least one embodiment of that present disclosure further provides a display device. FIG. 11 is a schematic plan view of a display substrate according to an embodiment of the present disclosure. As illustrated in FIG. 11, the display device 900 includes the display substrate 100 according to any embodiment described above. In this display substrate 100, by inserting a transition region between the high PPI region and the low PPI region, and arranging a row driving circuit in the transition region, the display substrate can drive the plurality of pixels in the first display region, the second display region and the transition region for display through the row driving circuit in the transition region by rows. Therefore, the display substrate does not need to be additionally provided with a region for placing the row driving circuit outside the low PPI region, so that the frame width of the display substrate can be reduced on the one hand, and the problem that four corner regions cannot be provided with the row driving circuit because they have been provided with opening patterns in the design of four curved surface screen can be solved on the other hand. Therefore, the display device has a narrow frame width and can realize a four curved surface screen design.

For example, the above-mentioned display device can be an electronic product with display function such as a television, a mobile phone, a computer, a navigator, and an electronic picture frame, etc.

It is to be noted that:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are merely particular embodiments of the present disclosure but are not limitative to the scope of the present disclosure: the scopes of the present disclosure should be defined in the appended claims.

The invention claimed is:

1. A display substrate, comprising:

a first display region;

a second display region, located on at least one side of the first display region in a first direction; and a transition region, located between the first display region and the second display region, wherein the first display region, the second display region and the transition region are provided with a plurality of pixels, the plurality of pixels are arranged in an array in the first direction and a second direction intersecting with the first direction, a pixel per inch (PPI) of the first display region is greater than a PPI of the second display region and a PPI of the transition region, the transition region comprises a row driving circuit, the row driving circuit comprises a gate driving circuit, the row driving circuit is configured to drive the plurality of pixels in the first display region, the second display region and the transition region in a row sequence, the row driving circuit comprises a plurality of row driving circuit units arranged in the second direction, each of the plurality of pixels comprises a plurality of sub-pixels, each of the plurality sub-pixels comprises an independent pixel driving circuit and a driving electrode electrically connected with the pixel driving circuit, and the transition region comprises:

a plurality of pixel circuit islands, each of the plurality of pixel circuit islands being provided with a plurality of pixel driving circuits of at least one of the plurality of pixels;

a plurality of first spacing regions, each of the plurality of first spacing regions being located between two pixel circuit islands adjacent in the first direction; and at least one driving spacing region, each of the at least one driving spacing region being also located between two pixel circuit islands adjacent in the first direction, the driving spacing region is provided with the row driving circuit unit, the transition region further comprises:

a plurality of driving electrode islands, arranged corresponding to the plurality of pixel circuit islands, each of the plurality of driving electrode islands being provided with a plurality of driving electrodes of at least one of the plurality of pixels; and a plurality of second spacing regions, each of the plurality of second spacing regions being located between two driving electrode islands adjacent in the first direction, the plurality of first spacing regions have equal widths in the first direction, the plurality of second spacing regions have equal widths in the first direction, and a width of each of the plurality of first spacing regions in the first direction is less than a width of each of the at least one driving spacing region in the first direction.

2. The display substrate according to claim 1, wherein a region located at a side of the second display region away from the transition region is provided with no gate driving circuit, the row driving circuit is located within the transition region.

3. The display substrate according to claim 1, wherein the row driving circuit unit comprises a first row driving circuit unit and a second row driving circuit unit, the first row driving circuit unit has an output terminal, and the output terminal of the first row driving circuit unit is configured to simultaneously drive a plurality of the pixels belonging to a same row in the first display region, the second display region and the transition region.

4. The display substrate according to claim 1, wherein a portion of the display substrate located in the second display region is bent in a direction perpendicular to the first display region.

5. The display substrate according to claim 1, further comprising:

a third display region, located at a side of the first display region in the second direction, wherein the third display region is provided with a plurality of the pixels, a PPI of the third display region is approximately equal to a PPI of the first display region, and an orthographic projection of the third display region on a reference line extending in the first direction overlaps with all of orthographic projections of the first display region, the second display region and the transition region on the reference line.

6. The display substrate according to claim 1, wherein the second display region comprises:

a plurality of pixel islands, arranged in an array in the first direction and the second direction, each of the plurality of pixel islands comprising at least one pixel;

a first opening, extending in the first direction and located between two pixel islands adjacent in the second direction; and a second opening, extending in the second direction and located between two pixel islands adjacent in the first direction.

7. A display device comprising the display substrate according to claim 1.

8. A display substrate, comprising:

a first display region;

a second display region, located on at least one side of the first display region in a first direction; and a transition region, located between the first display region and the second display region, wherein the first display region, the second display region and the transition region are provided with a plurality of pixels, the plurality of pixels are arranged in an array in the first direction and a second direction intersecting with the first direction, a pixel per inch (PPI) of the first display region is greater than a PPI of the second display region and a PPI of the transition region, the transition region comprises a row driving circuit, the row driving circuit comprises a gate driving circuit, the row driving circuit is configured to drive the plurality of pixels in the first display region, the second display region and the transition region in a row sequence, the row driving circuit comprises a plurality of row driving circuit units arranged in the second direction, each of the plurality of pixels comprises a plurality of sub-pixels, each of the plurality sub-pixels comprises an independent pixel driving circuit and a driving electrode electrically connected with the pixel driving circuit, and the transition region comprises:

a plurality of pixel circuit islands, each of the plurality of pixel circuit islands being provided with a plurality of pixel driving circuits of at least one of the plurality of pixels;

a plurality of first spacing regions, each of the plurality of first spacing regions being located between two pixel circuit islands adjacent in the first direction; and at least one driving spacing region, each of the at least one driving spacing region being also located between two pixel circuit islands adjacent in the first direction, the driving spacing region is provided with the row driving circuit unit, the transition region further comprises:

a plurality of driving electrode islands, arranged corresponding to the plurality of pixel circuit islands, each of the plurality of driving electrode islands being provided with a plurality of driving electrodes of at least one of the plurality of pixels; and a plurality of second spacing regions, each of the plurality of second spacing regions being located between two driving electrode islands adjacent in the first direction, the plurality of first spacing regions have equal widths in the first direction, the plurality of second spacing regions have equal widths in the first direction, and a width of each of the plurality of second spacing regions in the first direction is 0.5-1.5 times a width of each of the at least one driving spacing regions, and a width of each of the plurality of first spacing regions in the first direction are less than a width of each of the at least one driving spacing region in the first direction.

9. A display substrate, comprising:

a first display region;

a second display region, located on at least one side of the first display region in a first direction; and a transition region, located between the first display region and the second display region, wherein the first display region, the second display region and the transition region are provided with a plurality of pixels, the plurality of pixels are arranged in an array in the first direction and a second direction intersecting with the first direction, a pixel per inch (PPI) of the first display region is greater than a PPI of the second display region and a PPI of the transition region, the transition region comprises a row driving circuit, the row driving circuit comprises a gate driving circuit, the row driving circuit is configured to drive the plurality of pixels in the first display region, the second display region and the transition region in a row sequence, the row driving circuit comprises a plurality of row driving circuit units arranged in the second direction, each of the plurality of pixels comprises a plurality of sub-pixels, each of the plurality sub-pixels comprises an independent pixel driving circuit and a driving electrode electrically connected with the pixel driving circuit, and the transition region comprises:

a plurality of pixel circuit islands, each of the plurality of pixel circuit islands being provided with a plurality of pixel driving circuits of at least one of the plurality of pixels;

a plurality of first spacing regions, each of the plurality of first spacing regions being located between two pixel circuit islands adjacent in the first direction; and at least one driving spacing region, each of the at least one driving spacing region being also located between two pixel circuit islands adjacent in the first direction, the driving spacing region is provided with the row driving circuit unit, the transition region further comprises:

a plurality of driving electrode islands, arranged corresponding to the plurality of pixel circuit islands, each of the plurality of driving electrode islands being provided with a plurality of driving electrodes of at least one of the plurality of pixels; and a plurality of second spacing regions, each of the plurality of second spacing regions being located between two driving electrode islands adjacent in the first direction, wherein the display substrate further comprises:

a plurality of connection electrode structures, located at a side of the plurality of driving electrode islands close to the plurality of pixel circuit islands in a direction perpendicular to the transition region, wherein the plurality of connection electrode structures are arranged in one-to-one correspondence with the plurality of driving electrode islands and the plurality of pixel circuit islands, respectively, and each of the plurality of connection electrode structures comprises a plurality of connection electrodes, so as to electrically connect the plurality of pixel driving circuits in a corresponding pixel circuit island with the plurality of driving electrodes in a corresponding driving electrode island.

10. The display substrate according to claim 9, wherein the pixel driving unit comprises a driving transistor, and an orthographic projection of the driving transistor on a film layer where a corresponding driving electrode is located is spaced apart from the corresponding driving electrode.

11. The display substrate according to claim 10, wherein the row driving circuit further comprises a light-emitting control driving circuit, and the row driving circuit unit comprises a gate driving unit and a light-emitting control unit, the at least one driving spacing region comprises two driving spacing regions, one of the two driving spacing regions is provided with the gate driving unit, and the other of the two driving spacing regions is provided with the light-emitting control unit, the two driving spacing regions are spaced apart from each other by at least two of the plurality of first spacing regions.

12. The display substrate according to claim 11, wherein the light-emitting control unit comprises:

a first transistor, a gate electrode of the first transistor being connected with a first clock signal line to receive a first clock signal, a first electrode of the first transistor being connected with a first node, and a second electrode of the first transistor being connected with an input terminal;

a second transistor, a gate electrode of the second transistor being connected with the first node, a first electrode of the second transistor being connected with a second node, and a second electrode of the second transistor being connected with the first clock signal line to receive the first clock signal;

a third transistor, a gate electrode of the third transistor being connected with the first clock signal line to receive the first clock signal, a first electrode of the third transistor being connected with the second node, and a second electrode of the third transistor being connected with a first power line to receive a first voltage;

a fourth transistor, a gate electrode of the fourth transistor being connected with a second clock signal line to receive a second clock signal, a first electrode of the fourth transistor being connected with the first node, and a second electrode of the fourth transistor being connected with a second electrode of a fifth transistor;

the fifth transistor, a gate electrode of the fifth transistor being connected with the second node, and a first electrode of the fifth transistor being connected with a second power line to receive a second voltage;

a sixth transistor, a first electrode of the sixth transistor being connected with the second clock signal line to receive the second clock signal, and a second electrode of the sixth transistor being connected with a third node;

a seventh transistor, a gate electrode of the seventh transistor being connected with the second clock signal line to receive the second clock signal, a first electrode of the seventh transistor being connected with the third node, and a second electrode of the seventh transistor being connected with a fourth node;

an eighth transistor, a gate electrode of the eighth transistor being connected with the first node, a first electrode of the eighth transistor being connected with the fourth node, and a second electrode of the eighth transistor being connected with the second power line to receive the second voltage;

a ninth transistor, a gate electrode of the ninth transistor being connected with the fourth node, a first electrode of the ninth transistor being connected with the second power line to receive the second voltage, and a second electrode of the ninth transistor being connected with an output terminal;

a tenth transistor, a first electrode of the tenth transistor being connected with the first power line to receive the first voltage, and a second electrode of the tenth transistor being connected with the output terminal;

a first capacitor, a second electrode of the first capacitor being connected with the third node;

a second capacitor, a second electrode of the second capacitor being connected with the second clock signal line to receive the second clock signal; and a third capacitor, a first electrode of the third capacitor being connected with the fourth node, and a second electrode of the third capacitor being connected with the second power line to receive the second voltage.

13. The display substrate according to claim 12, wherein orthographic projections of the ninth transistor and the tenth transistor on a film layer where the plurality of connection electrode structures are located are spaced apart from the plurality of connection electrode structures.

14. The display substrate according to claim 11, wherein the gate driving unit comprises an input transistor, a first control transistor, a second control transistor, an output control transistor, a gate output transistor, a first noise reduction transistor, a second noise reduction transistor, a voltage stabilizing transistor, a first scanning capacitor and a second scanning capacitor, wherein a gate electrode of the input transistor is connected with a third clock signal line, a second electrode of the input transistor is connected with an input terminal, and a first electrode of the input transistor is connected with a first scanning node;

a gate electrode of the first control transistor is connected with the first scanning node, a second electrode of the first control transistor is connected with the third clock signal line, and a first electrode of the first control transistor is connected with a second scanning node;

a gate electrode of the second control transistor is connected with the third clock signal line, a second electrode of the second control transistor is connected with a third power line, and a first electrode of the second control transistor is connected with the second scanning node;

a gate electrode of the output control transistor is connected with the second scanning node, a first electrode of the output control transistor is connected with a fourth power line, and a second electrode of the output control transistor is connected with an output terminal;

a first electrode of the first scanning capacitor is connected with the second scanning node, and a second electrode of the first scanning capacitor is connected with the fourth power line;

a gate electrode of the gate output transistor is connected with a third scanning node, a first electrode of the gate output transistor is connected with a second clock sub-signal line, and a second electrode of the gate output transistor is connected with the output terminal;

a first electrode of the second scanning capacitor is connected with the third scanning node, and a second electrode of the second scanning capacitor is connected with the output terminal;

a gate electrode of the first noise reduction transistor is connected with the second scanning node, a first electrode of the first noise reduction transistor is connected with the fourth power line, and a second electrode of the first noise reduction transistor is connected with a second electrode of the second noise reduction transistor;

a gate electrode of the second noise reduction transistor is connected with a fourth clock signal line, and a first electrode of the second noise reduction transistor is connected with the first scanning node; and a gate electrode of the voltage stabilizing transistor is connected with the third power line, a second electrode of the voltage stabilizing transistor is connected with the first scanning node, and a first electrode of the voltage stabilizing transistor is connected with the third scanning node.

15. The display substrate according to claim 14, wherein orthographic projections of the output control transistor and the gate output transistor on a film layer where the plurality of connection electrode structures are located are spaced apart from the plurality of connection electrode structures.

16. The display substrate according to claim 11, further comprising:

a plurality of first driving lines, configured to drive the plurality of gate driving units, wherein the plurality of gate driving units are arranged in a staggered way in the first direction, and each of the plurality of first driving lines comprises a first portion extending in the second direction and a second portion extending in the first direction, the first portion is connected with the corresponding gate driving unit, and the second portion connects the first portions of two adjacent gate driving units.

17. The display substrate according to claim 11, further comprising:

a plurality of second driving lines, configured to drive the plurality of light-emitting control units, wherein the plurality of light-emitting control units are arranged in a staggered way in the first direction, and each of the plurality of second driving lines comprises a third portion extending in the second direction and a fourth portion extending in the first direction, wherein the third portion is connected with a corresponding light-emitting control unit, and the fourth portion connects the third portions of two adjacent light-emitting control units.

* * * * *